United States Patent [19]

Lau et al.

[11] Patent Number: 5,045,502

[45] Date of Patent: Sep. 3, 1991

[54] PDIN OHMIC CONTACT TO GAAS

[75] Inventors: Silvanius S. Lau, San Diego, Calif.; Timothy D. Sands, Cranbury, N.J.; Long-Ching Wang, La Jolla, Calif.

[73] Assignees: Bell Communications Research, Inc., Livingston, N.J.; University of California, Oakland, Calif.

[21] Appl. No.: 522,175

[22] Filed: May 10, 1990

[51] Int. Cl.$^5$ .......................................... H01L 21/283
[52] U.S. Cl. ...................................... 437/184; 357/65; 357/71
[58] Field of Search ...................... 437/184; 357/71, 65

[56] References Cited

U.S. PATENT DOCUMENTS

| 4,011,583 | 3/1977 | Levinstein et al. | 357/67 |
| 4,796,082 | 1/1989 | Murakami et al. | 357/71 |
| 4,847,675 | 7/1989 | Eng | 357/71 |

OTHER PUBLICATIONS

E. D. Marshall et al, "Nonalloyed Ohmic Contacts to n–GaAs by Solid–Phase Epitaxy of Ge", *Journal of Applied Physics*, 1987, vol. 62, pp. 942–947.

L. C. Wang et al, "An Investigation of a Nonspiking Ohmic Contact to n–GaAs Using the Si/Pd System", *Journal of Materials Research*, 1988, vol. 3, pp. 922–930.

E. D. Marshall et al, "Ohmic Contact Formation Mechanism in the Ge/Pd/n–GaAs System", *Material Research Society Symposium Proceedings*, 1989, vol. 148, pp. 163–168.

S. L. Wright et al, "In situ Contacts to GaAs Based on InAs", *Applied Physics Letters*, 1986, vol. 49, pp. 1545–1547.

D. C. Marvin et al, "In/Pt Ohmic Contacts to GaAs", *Journal of Applied Physics*, 1985, vol. 58, pp. 2659–2661.

J. Ding et al, "In/GaAs Reaction: Effect of an Intervening Oxide Layer", *Applied Physics Letters*, 1986, vol. 49, pp. 818–820.

T. Sands et al, "Initial Stages of the Pd–GaAs Reaction: Formation and Decomposition of Ternary Phases", *Thin Solid Films*, 1986, vol. 136, pp. 105–122.

L. H. Allen et al, "Ohmic Contacts to n–GaAs Using In/Pd Metallization", *Applied Physics Letters*, 1987, vol. 51, pp. 326–327.

T. Sands et al., "Solid–Phase Regrowth of Compound Semiconductors by Reaction–Driven Decomposition of Intermediate Phases", *Journal of Materials Research*, 1988, vol. 3, pp. 914–921.

M. Murakami et al, "Thermally Stable, Low–Resistance NiInW Ohmic Contacts to n–Type GaAs", *Applied Physics Letters*, 1987, vol. 51, pp. 664–666.

*Primary Examiner*—Olik Chaudhuri
*Assistant Examiner*—David E. Graybill
*Attorney, Agent, or Firm*—James W. Falk; Charles S. Guenzer

[57] ABSTRACT

An ohmic contact to a semiconductor such as GaAs and its method of making in which a thin layer of Pd is overlaid preferably with a layer of Group-IV element such as Ge followed by another layer of Pd. This structure is then overlaid with a layer of Pd and In. The atomic ratio of the Pd and In in the entire structure lies between 0.9 and 1.5. This structure is then annealed at a temperature between 350° C. and 675° C. There results a very thin crystalline layer of Ge-doped InGaAs adjacent the GaAs and an overlying PdIn alloy layer providing a contact resistance in the range of 0.1–1 Ω-mm.

14 Claims, 1 Drawing Sheet

PDIN OHMIC CONTACT TO GAAS

GOVERNMENT RIGHTS

This invention was made partially with government support under Contract No. MDA 903-87-K0762P0004 awarded by the Defense Advanced Research Projects Agency. The government has certain rights in this invention.

FIELD OF THE INVENTION

This invention relates generally to semiconductor ohmic contacts. In particular, the invention relates to the low-temperature fabrication of low-resistance, thermally stable contacts to gallium arsenide and other compound semiconductor devices.

BACKGROUND OF THE INVENTION

Most semiconductor devices require low-resistance contacts that allow the passage of electrical current from the semiconductor to the external circuit or to other semiconductor devices. These contacts, known as ohmic contacts, must be of sufficiently low resistance so as to contribute negligble voltage drop as compared to the voltage drops within the semiconductor device itself. Ohmic contacts to gallium arsenide (GaAs) semiconductor devices are required for the fabrication of field-effect transistors, lasers, light-emitting diodes, photodetectors and many other discrete and integrated devices. High-performance devices, particularly those that have submicron dimensions and are composed of many thin layers of GaAs and related semiconductors such as aluminum-gallium arsenide (AlGaAs) or indium-gallium arsenide (InGaAs), require contacts that are of very low resistance ($<1\Omega$-mm). Furthermore, such contacts should be shallow and uniform. In other words, the contact metallization should not consume the GaAs in an irregular way. Deep penetrations of contact metal prevent control of the semiconductor layer to be contacted. Still further, the electrical characteristics of the contact should not deteriorate during thermal treatments required for circuit fabrication and packaging steps performed after ohmic contact fabrication. Such processing and packaging steps such as brazing and polyamide curing may require prolonged annealing at temperatures up to 400° C. The ohmic contact must be stable at temperatures at least as high as this annealing temperature.

Ohmic contacts to n-type GaAs that exhibit low contact resistance (0.1-1$\Omega$-mm) can be fabricated by employing metallizations such as gold-germanium-nickel. Contacts of this type become ohmic during an annealing treatment at a moderate temperature (400°-500° C.), which causes the laterally nonuniform consumption of the GaAs during localized melting of the metallization. The contact interface projects as deep as 0.2 $\mu$m into the GaAs substrate. The metallization spreads laterally as well, making these contacts inappropriate for submicron and shallow junction devices.

This uniformity problem has been solved by employing metallizations such as germanium-palladium and silicon-palladium that react uniformly without melting. We and others have disclosed such a solution in three technical articles, a first by Marshall et al entitled "Nonalloyed ohmic contacts to n-GaAs by solid-phase epitaxy of Ge" appearing in Journal of Applied Physics, volume 62, 1987 at pages 942-947, a second by Wang et al entitled "An investigation of a nonspiking Ohmic contact to n-GaAs using the Si/Pd system" appearing in Journal of Materials Research, volume 3, 1988 at pages 922-930, and a third by Marshall et al entitled "Ohmic contact formation mechanism in the Ge/Pd/n-GaAs system" appearing in Materials Research Symposium Society Proceedings, volume 148, 1989 at pages 163-168. Both these types of contacts contain group-IV elements from the fourth column of the periodic table, i.e., germanium, silicon, or tin, which is, we believe, incorporated within or directly upon the gallium arsenide surface as a result of a thermal treatment. It is this Ge:GaAs layer that results in the low contact resistance. Specifically, the germanium may initially occupy gallium sites in the GaAs, thereby donating conduction electrons which makes the potential barrier at the metal-semiconductor interface more transparent to electrons. Alternatively, the germanium can reside in intimate contact with the GaAs, thereby reducing the height of the potential barrier.

The fact that germanium and the other group-IV elements can also occupy the arsenic site in a GaAs crystal, however, results in an inherent instability of contacts based on group-IV elements. Group-IV elements on arsenic sites act as acceptors of electrons, thereby counteracting the effects of the group-IV elements on gallium sites. When a contact based on group-IV elements is annealed at temperatures of 400° C. and above, the compensation of donors by acceptors leads to an increase in the contact resistance.

Earlier proposals for ohmic junctions have involved the use of indium. Wright et al have disclosed an abrupt but ohmic junction between InAs and GaAs in a technical article entitled "In situ contacts to GaAs based on InAs" appearing in Applied Physics Letters, volume 49, 1986 at pages 1545-1547. Marvin et al have disclosed the diffusion of In through an intervening Pt layer to form InGaAs in the GaAs substrate in a technical article entitled "In/Pt ohmic contacts to GaAs" appearing in Journal of Applied Physics, volume 58, 1985 at pages 2659-2661. In a technical article entitled "In/GaAs reaction: Effect of an intervening oxide layer" appearing in Applied Physics Letters, volume 49, 1986 at pages 818-820, Ding et al have emphasized the epitaxial crystallinity of the InGaAs regions formed by coating GaAs with an indium layer.

Other proposals have involved the use of palladium. One of the present inventors and others have discussed the chemical reactions at the palladium/gallium-arsenide junction in a technical article by Sands et al entitled "Initial stages of the Pd-GaAs reaction: Formation and decomposition of ternary phases" appearing in Thin Solid Films, volume 136, 1986 at pages 105-122.

Yet further proposals have involved both indium and palladium. Allen et al have disclosed such an ohmic contact in a technical article entitled "Ohmic contacts to n-GaAs using In/Pd metallization" appearing in Applied Physics Letters, volume 51, 1987 at pages 326-327. Allen et al first evaporated on the GaAs substrate a 40 nm palladium layer and then a 400 nm In layer. A 500° C. anneal then produced a GaAs/In$_3$Pd-/In structure. The authors nonetheless believed that InGaAs was formed between the GaAs and the In$_3$Pd. The present inventors and another have discussed the mechanics of the Allen et al article in a technical article entitled "Solid-phase regrowth of compound semiconductors by reaction-driven decomposition of intermediate phases" appearing in Journal of Materials Research, volume 3, 1988 at pages 914-921. In that article we considered both combinations of palladium-germanium and palladium-indium and concluded that they produced ohmic contacts to GaAs by somewhat different mechanisms.

Murakami et al have disclosed low resistance, thermally stable contacts in U.S. Pat. No. 4,796,082 and in a technical article entitled "Thermally stable, low-resistance NiInW ohmic contacts to n-type GaAs" appearing in Applied Physics Letters, volume 51, 1987 at pages 664-666. These ohmic contacts are fabricated by employing a combination of indium and a transition metal such as nickel, palladium, or platinum. The indium reacts with GaAs to form a layer of InGaAs. This layer of InGaAs, sandwiched between layer of the metal and a GaAs substrate, produces a low resistance contact as a result of the reduced potential barriers, an effect that is well known to those skilled in the art. However, the Murakami contacts suffer several disadvantages.

Such contacts are only stable if the ratio of transition metal to indium is sufficient to completely consume the indium and other low-melting-point phases during thermal annealing. If unreacted indium remains in the contact, a portion of the contact will melt whenever the contact temperature exceeds 156° C., the melting point of indium. Such repeated melting prevents the application of such contacts in submicron devices.

Indium-based contacts that contain only a small amount of indium are stable at high temperatures. Murakami et al require that the atomic percentage of indium be less than 70%. However, low-indium contacts must be annealed at temperatures above 700° C. to attain low values of contact resistance. The incongruent evaporation point for GaAs is about 650° C. in vacuum. Above these temperatures, As preferentially evaporates, leaving globules of Ga. To prevent this catastrophic decomposition of the GaAs substrate, Murakami et al cap the substrate with a refractory material such as silicon nitride. Alternatively, the contact could be annealed in a hazardous arsenic vapor ambient. Both alternatives add extra steps and expense to the processing of GaAs devices and circuits. Furthermore, the high temperatures result in the agglomeration of the metallization, with penetrations of the metallization as deep as 70 nm into the GaAs substrate. Murakami et al prevent the metallization from becoming electrically discontinuous by depositing a thin metallic refractory layer on the transition-metal/indium contact before annealing. Although this capping layer maintains the electrical continuity of the metallization, it must be kept thin (<10 nm) to allow standard lift-off patterning. As a result of the limited thickness of the refractory metal cap, the sheet resistance of the annealed metallization is unacceptably high (~10Ω/□). To reduce the sheet resistance by a factor of five to ten, an additional layer of a low resistivity metal such as gold must be deposited after contact annealing. These extra processing steps add to the complexity and expense of GaAs device and circuit fabrication.

SUMMARY OF THE INVENTION

Accordingly, an object of the invention is to provide a low-resistance ohmic contact for GaAs and other compound semiconductors.

A further object of the invention is to provide such an ohmic contact that does not require processing above 700° C.

A yet further object of the invention is to provide such an ohmic contact that is stable at least at temperatures of 400° C.

Yet another object of the invention is to provide a shallow ohmic contact.

The invention can be summarized as an ohmic contact and its method of making for an ohmic contact to GaAs and other compound semiconductors. The ohmic contact is primarily an alloy of palladium and indium. Preferably a layer of a group-IV element is separated from the GaAs by a thin layer of Pd which dissolves the native oxide. Overlying the group-IV layer is a another layer of palladium. These layers form a uniform layer of a palladium-gallium-arsenic phase. Overlying these layers are palladium and indium. The atomic ratio of all palladium to indium in the contact is between 0.9 and 1.5. In a thermal anneal below 700° C., the palladium/indium dissolves the palladium-gallium-arsenic phase to form a very shallow crystalline layer of indium-gallium arsenide, doped with the group-IV element overlain with a polycrystalline palladium/indium phase.

DETAILED DESCRIPTION

Figure 1:
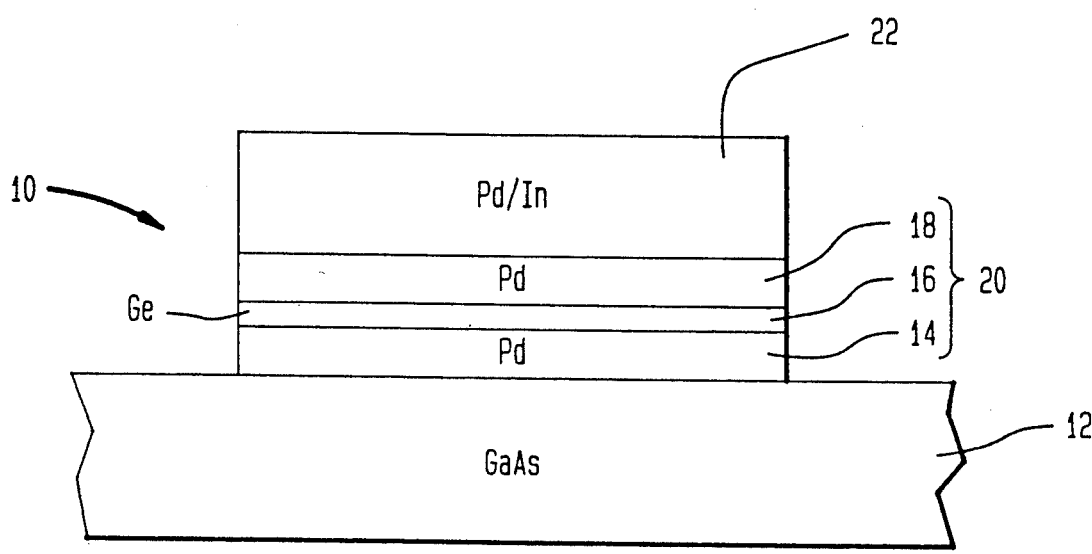
FIG. 1 is an expanded side view of an ohmic contact of the invention after deposition of the metal layers and after patterning but before contact annealing.

FIG. 1 shows a side view of a portion of a semiconductor device 10 or component such as a field-effect transistor, bipolar transistor, diode, laser or any other device that requires a low resistance contact to an external circuit or to another semiconductor device. The device 10 is fabricated on a substrate 12 of a compound semiconductor material such as GaAs. The substrate 12 may include layers of other semiconductors such as AlGaAs, InGaAs, or InP.

The contact comprises a stack of layers which may be deposited sequentially by thermal evaporation, electron-beam evaporation or sputtering. Prior to these depositions, a polymeric mask is patterned on the substrate 12 by a technique such as optical lithography. The masking material is removed in those areas where the ohmic contact is desired. After the depositions of the layers and prior to the annealing, the remaining masking material is removed, thereby lifting off the undesired portions of the layers. A first palladium layer 14 is deposited to a thickness in the range of 5-50 nm. The palladium provides a uniform reaction with the gallium arsenide substrate 12 as palladium is the only metal that uniformly penetrates the thin oxide layer on a GaAs substrate 12 at room temperature. A group-IV layer 16 is a thin film of an element from the fourth column of the periodic table (germanium, silicon or tin). The group-IV layer 16 should be less than 10 nm in thickness so as not to hinder the interaction of palladium in neighboring layers 14 and 18 with the indium in an upper portion 22 of the contact. Carbon is not preferred as the group-IV element because it has a tendency to act as an acceptor rather than a donor. The group-IV element in layer 16 provides low contact resistance at processing temperatures as low as 375° C. Following deposition of the group-IV layer 16, a second palladium layer 18 is deposited. The thickness of the second palladium layer can be from 5 to 100 nm.

Although the most preferred embodiment of the invention includes the group-IV layer 16, it is possible to achieve satisfactory ohmic contacts without it.

The layers 14, 16 and 18 together are known as a lower portion 20 of the contact. A function of the lower portion 20 is to provide the initial reaction with the GaAs substrate 12 to form a uniform monocrystalline layer of a palladium-gallium-arsenic phase that contains the group-IV element. This reaction occurs at low temperatures (<250° C.). The palladium dissolves the native oxide on the GaAs surface. Only a very thin (~5 nm) lower Pd layer 14 is thus required. Ding et al have disclosed the effect of the oxide layer in the previously cited technical article.

An upper portion 22 of the contact comprises deposited layers of palladium and indium or a uniform mixture of palladium and indium. The number of layers in this upper portion does not have a significant effect on the contact resistance or stability. The thickness and composition of this portion is such that the atomic ratio of palladium to indium averaged over the entire contact, including both the upper and lower portions 20 and 22, is between 0.9 and 1.5. Disregarding the group-IV contribution, this ratio range corresponds to an indium atomic percentage of between 40% and 52.6%. It is well known that this composition range of the palladium-indium phase has a melting point greater than 1200° C.

Figure 2:
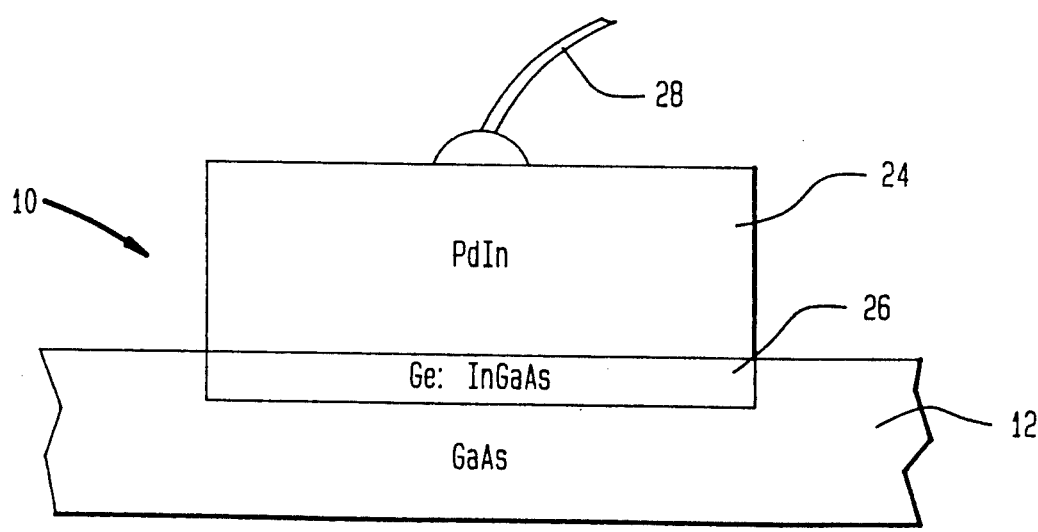
FIG. 2 is the expanded side view of the same contact after annealing to form a low resistance contact.

A function of this upper portion 22 is to react with the lower portion 20 of the contact, including the palladium-gallium-arsenic phase. This reaction forms, as illustrated in FIG. 2, a uniform film 24 of the previously-mentioned palladium-indium phase and a monocrystalline layer 26 of InGaAs containing the group-IV element originally in the group-IV layer 16. Of course, in the embodiments not including the group-IV layer 16, there is no group-IV element in the InGaAs layer 26. The InGaAs layer 26 is formed by the rejection of gallium, arsenic, and the group-IV element from the initial palladium-gallium-arsenic layer that formed adjacent to the GaAs 12. The indium is incorporated into the InGaAs layer 26 by the diffusion of indium from the upper portion 22 of the contact to the lower portion 20 during the contact annealing treatment at temperatures greater than approximately 450° C. The driving force for the reaction is the formation of the stable palladium-indium phase 24. The contact annealing treatment may be accomplished by flash annealing with incoherent lamps in an inert ambient such as argon gas at temperatures greater than approximately 350° C. for times between as short as one second and as long as several minutes. Alternative annealing techniques such as conventional furnace annealing may also be used.

After annealing, the monocrystalline InGaAs layer 26 uniformly covers the entire interface between the GaAs substrate 12 and the palladium-indium layer 24. It has been observed that this InGaAs layer 26 penetrates a maximum of 20 nm into the GaAs substrate 12 as measured from the original surface of the GaAs substrate 12 before deposition of the first palladium layer 14. Penetration depths of 5 to 15 nm have been observed. This penetration is substantially less than the penetration depth of the corresponding InGaAs layer of Murakami et al, measured by them to be 70 nm.

The ohmic contact fabricated as described above can be electrically tested with a microprobe. However, to complete the contact for an operational device, a gold wire 28 can be bonded to the surface of the InPd film 24, as illustrated in FIG. 2. Alternatively, in an integrated circuit, a gold interconnect can be deposited having an end formed on the surface of the InPd film 24.

EXAMPLE 1

In a first example of the invention, a semi-insulating (100) GaAs wafer was used as a substrate for the subsequent epitaxial growth of a thin surface layer 12 of GaAs by organo-metallic vapor deposition (OMCVD). This sheet layer 12 had a thickness of 0.2 μm, was doped n-type with $1 \times 10^{18}$ cm$^{-3}$ of silicon and had a surface resistivity of 150Ω/□. After surface growth, the substrates were degreased with trichloroethylene, acetone and isopropyl alcohol and were then rinsed with de-ionized water. The so cleaned substrates were etched in a solution of HCl:H$_2$O (1:1 by volume) for two minutes to remove the native oxide. The substrates were then photolithographically patterned with photo-resist for transmission line measurements of the contact resistance. In actual device contacts, the patterning would be for the device contact area. The samples again underwent the HCl:H$_2$O treatment immediately before loading into an electron beam evaporator. The base pressure in the electron beam evaporator was $\sim 4 \times 10^{-8}$ torr.

In this first example, there was no group-IV layer 16. The combined thickness of the palladium layers 14 and 18 was 25 nm. The Pd/In upper portion 22 was achieved by growing twenty periods of a superlattice, each period consisting of 5 nm of In and 1.2 nm of Pd. In this and other examples, the total thickness of the deposited metallization layers, prior to annealing, was 150 nm.

After the growth, the patterned photo-resist was lifted off, thereby removing the undesired portions of the deposited layers 14, 16 and 22. Then the samples were annealed in a Heatpulse 210 rapid thermal annealing system in an argon atmosphere for less than one minute at temperatures between 500° and 700° C. The annealing time decreased with increasing temperature and was 5 seconds at 700° C.

Contact resistances were determined by transmission line measurements. Any thermal stability was assessed by annealing the sample at 400° or 500° C. in a tube furnace with a flowing H$_2$(15%)/N$_2$(85%) ambient.

The initial contact resistance for Example 1 is tabulated in Table 1 for a variety of annealing temperatures and associated annealing times. It is seen that the best contact resistances for Example 1 are obtained for annealing temperatures between 600° and 650° C. Above or below this range the contact resistance quickly increases.

TABLE 1

| Annealing Temp. (°C.) | Annealing Time (sec) | Contact Resistance (ohm-mm) | | | |
|---|---|---|---|---|---|
| | | Example 1 | Example 3 | Example 4 | Example 5 |
| 375 | 40 | — | — | — | 0.079 |
| 400 | 30 | — | — | — | 0.080 |
| 450 | 20 | — | — | — | 0.085 |
| 500 | 5 | 6.83 | 4.64 | 0.0841 | 0.121 |
| 550 | 5 | 0.332 | 0.428 | 0.125 | 0.155 |
| 600 | 5 | 0.161 | 0.202 | 0.188 | 0.194 |
| 650 | 5 | 0.167 | 0.131 | 0.122 | 0.160 |
| 700 | 5 | 0.571 | 1.11 | 0.127 | 0.213 |

The thermal stability for the ohmic contact of Example 1 is shown in the data of Tables 2 and 3. In these tables, the contact resistance is shown as function of the aging time while the ohmic contact is held at 400° C. and 500° C. for Tables 2 and 3 respectively. The zero-time contact resistance is the as-annealed value, where the annealing conditions for the particular sample are given in the parentheses. Although the contact resistance does increase somewhat, these elevated temperatures would be experienced for only a short time during subsequent processing steps.

TABLE 2

| Aging Time at 400° C. (hours) | Contact Resistance (ohm-mm) | | | |
|---|---|---|---|---|
| | Example 1 (650° C..5s) | Example 3 (650° C..5s) | Example 4 (650° C..5s) | Example 5 (650° C..5s) |
| 0 | 0.167 | 0.131 | 0.122 | 0.158 |
| 1 | 0.170 | 0.136 | 0.115 | 0.14 |
| 3 | 0.192 | 0.145 | 0.0925 | 0.151 |
| 5 | 0.211 | | 0.088 | |
| 6 | | 0.168 | | 0.14 |
| 10 | 0.205 | 0.154 | 0.096 | 0.127 |
| 15 | | | 0.098 | |
| 27 | 0.225 | 0.165 | | 0.142 |
| 31 | | | 0.098 | |

TABLE 3

| Aging Time at 500° C. (hours) | Contact Resistance (ohm-mm) | | | |
|---|---|---|---|---|
| | Example 1 (650° C..5s) | Example 3 (650° C..2s) | Example 4 (700° C..5s) | Example 5 (675° C..5s) |
| 0 | 0.135 | 0.187 | 0.138 | 0.172 |
| 1 | 0.200 | 0.218 | 0.156 | 0.169 |
| 2 | 0.232 | 0.243 | 0.161 | 0.184 |
| 4 | 0.297 | 0.265 | 0.166 | 0.216 |
| 7 | 0.341 | 0.287 | 0.176 | 0.231 |
| 10 | 0.273 | 0.290 | 0.152 | 0.219 |
| 30 | 0.366 | 0.366 | 0.257 | 0.381 |

EXAMPLE 2

A second example of the invention was identical to the first example except that the superlattice structure for the Pd/In upper portion 20 was replaced by a uniform PdIn region formed by co-deposition of amounts of Pd and In equivalent to the superlattice thickness. There were no significant differences in the contact resistance observed between the first and second examples.

EXAMPLE 3

A third example of the invention again dispensed with the group-IV layer 16 and the combined thickness of the palladium layers 14 and 18 was 25 nm. The Pd/In upper portion 22 was achieved by growing 100 nm of In and then 25 nm of Pd. The processing was otherwise as for the first example.

The contact resistance as a function of annealing temperature for Example 3 is given in Table 1 and the aging data are presented in Tables 2 and 3.

From the first three examples, it is apparent that it is relatively unimportant whether the Pd and In in the Pd/In upper portion 22 are deposited separately or together.

Prior art high temperature annealing above 700° C. required caps or high-pressure arsenic ambients. The first three examples omitted the group-IV layer 16 and still achieved good ohmic contact values for annealing temperatures between 600° C. and 700° C. Thereby, the present invention even without the group-IV element allows simplified processing within a fairly narrow range of annealing temperatures.

EXAMPLE 4

A fourth example of the invention used Ge as the group-IV element in the group-IV layer 16, which was 2 nm thick. Each of the palladium layers 14 and 18 were 12.5 nm thick. The Pd/In upper portion 22 comprised 20 periods of 2.5 nm of Pd and 10 nm of In. Thus, the fourth example differed from the first example only in the 2 nm thick Ge layer positioned in the middle of the Pd layers 14 and 18.

The contact resistance as a function of annealing temperature is given in Table 1. The resistance is very low over the tested annealing temperatures of 500° C. to 700° C. As shown in the aging data of Tables 2 and 3, such an ohmic contact is stable for subsequent processing at 400° C. and 500° C.

EXAMPLE 5

A fifth example of the invention resembled the fourth example except that the Pd/In upper portion 22 comprised a 100 nm In layer and a 25 nm Pd layer. It thus resembled the third example except for the inclusion of the Ge layer. The annealed contact resistance, shown by the data of Table 1 was uniformly low over the tested annealing temperatures which extended down to 375° C. The aging data shown in Table 2 and 3 demonstrates the stability of the ohmic contact. Thus, the invention is usable in a low temperature (down to 375° C.) process.

Although the examples used only Ge for the group-IV layer 16, Si or Sn could be used instead since they exhibit similar semiconductor bonding. Although GaAs has been the substrate in the foregoing examples, other semiconductor compositions may be used, especially those of the compound III-V semiconductors.

The last two examples show that the use of a group-IV element with the invention provides a further reduction of the contact resistance. These values are to be compared with a typical value of 0.3Ω-mm for a tungsten-capped nickel-indium metallization. Importantly, however, these low values of contact resistance are achievable at annealing temperatures well below the incongruent evaporation point of 650° C. Therefore, the conditions for annealing are not particularly constrained. If required for prior processing steps, the annealing can be performed at relatively low temperatures. On the other hand, these ohmic contacts retain their low contact resistance even after prolonged exposure to processing temperatures up to 500° C.

Thus, the invention provides a stable ohmic contact of low contact resistance that is compatible with many types of semiconductor fabrication.

What is claimed is:

1. A method of forming an ohmic contact, comprising the steps of:
   a first step of depositing a lower layer comprising palladium on a surface of an n-type semiconductor comprising gallium and arsenic;
   a second step of depositing an upper layer comprising palladium and indium on said lower layer, wherein a ratio of a total atomic amount of palladium to a total atomic amount of indium contained in a combination of said upper and lower layers lies in a range of 0.9 to 1.5; and
   annealing said lower and upper layers at an annealing temperature.

2. A method as recited in claim 1, wherein said annealing temperature is no higher than approximately 700° C.

3. A method as recited in claim 1, wherein said first step comprises:
   depositing a first layer comprising palladium on said surface;
   depositing a second layer comprising a group-IV element on said first layer, said group-IV element chosen from the group consisting of germanium, silicon and tin; said lower layer comprising said first and second layers.

4. A method as recited in claim 3, wherein said second layer is less than 10 nm in thickness.

5. A method as recited in claim 4, wherein said first layer has a thickness in a range of 5 to 50 nm.

6. A method as recited in claim 1, wherein said lower layer deposited by said first step further comprises a group-IV element chosen from the group consisting of germanium, silicon and tin.

7. A method as recited in claim 5, wherein said group-IV element comprises germanium.

8. A method as recited in claim 5, wherein said annealing temperature lies between 350° C. and 675° C.

9. A method of forming an ohmic contact, comprising the steps of:
   depositing on an n-type semiconductor comprising gallium and arsenic a first layer comprising palladium and a group-IV element chosen from the group consisting of silicon, germanium and tin, at least a portion of said palladium being deposited at least as close to said semiconductor as all of said group-IV element;
   depositing on said first layer a second layer comprising palladium and indium; and
   annealing at least said second layer.

10. A method as recited in claim 9, wherein a ratio of a total atomic amount of palladium to a total atomic amount of indium contained in a combination of said first and second layers lies in a range between 0.9 and 1.5.

11. A method as recited in claim 9, wherein said step of depositing said first layer comprises depositing a third layer no thicker than 50 nm and comprising palladium on said semiconductor and depositing a fourth layer of thickness less than 10 nm and comprising said group-IV element on said third layer.

12. A method as recited in claim 9, wherein said group-IV element comprises Ge.

13. A method as recited in claim 12, wherein said semiconductor comprises GaAs as a principal component.

14. A method as recited in claim 11, wherein a ratio of a total atomic amount of palladium to a total atomic amount of indium contained in a combination of said first and second layers lies in a range between 0.9 and 1.5.

* * * * *